(12) United States Patent
Holter

(10) Patent No.: US 6,923,701 B2
(45) Date of Patent: Aug. 2, 2005

(54) DISPLAY WITH MICRO POCKETS

(75) Inventor: Børre Holter, Svelvik (NO)

(73) Assignee: PolyDisplay ASA (NO)

( * ) Notice: Subject to any disclaimer, the term of this patent is extended or adjusted under 35 U.S.C. 154(b) by 0 days.

(21) Appl. No.: 10/294,330

(22) Filed: Nov. 14, 2002

(65) Prior Publication Data

US 2003/0124931 A1 Jul. 3, 2003

Related U.S. Application Data

(60) Provisional application No. 60/331,326, filed on Nov. 14, 2001.

(30) Foreign Application Priority Data

Nov. 14, 2001 (NO) .......................................... 2001 5569

(51) Int. Cl.[7] .............................. H01J 9/00; H01J 9/24
(52) U.S. Cl. .......................... 445/24; 445/25; 349/187; 349/189; 349/190
(58) Field of Search ............... 445/24–25; 439/187–190

(56) References Cited

U.S. PATENT DOCUMENTS

| | | | |
|---|---|---|---|
| 3,863,332 A | * | 2/1975 | Leupp et al. ............... 349/187 |
| 5,347,154 A | | 9/1994 | Takahashi et al. |
| 5,668,617 A | | 9/1997 | Na |
| 5,831,710 A | | 11/1998 | Colgan et al. |
| 5,978,062 A | | 11/1999 | Liang et al. |
| 6,066,018 A | | 5/2000 | Grupp et al. |
| 6,163,357 A | | 12/2000 | Nakamura |
| 6,166,797 A | | 12/2000 | Bruzzone et al. |
| 6,172,723 B1 | * | 1/2001 | Inoue et al. ................... 349/95 |
| 6,266,122 B1 | | 7/2001 | Kishimoto et al. |
| 2002/0180673 A1 | * | 12/2002 | Tsuda et al. .................. 345/87 |

FOREIGN PATENT DOCUMENTS

| | | |
|---|---|---|
| EP | 0 486 318 A 1 | 5/1992 |
| GB | 2321718 A | 8/1998 |
| SE | P5 511 511 | 10/1999 |
| WO | WO 99/31646 | 6/1999 |
| WO | WO 00/69649 | 11/2000 |

OTHER PUBLICATIONS

International Search Report Application No. NO 2001 5569.
International Search Report Application No. PCT/NO02/00421.

* cited by examiner

Primary Examiner—Nimeshkumar D. Patel
Assistant Examiner—Mariceli Santiago
(74) Attorney, Agent, or Firm—Banner & Witcoff, Ltd.

(57) ABSTRACT

The present invention relates to a thin display (15), and a method of manufacturing the same. The display (15) comprises an isolated substrate 80), with cavities (60) also called micro pockets in a pattern, or created with a separate sheet (55) with holes (60) mounted on the substrate (80). These micro pockets (60) will make the picture elements of the display (15). The display (15) further comprises perforated holes (70) in the centre of the micro pockets (60) and a conductive material (40, 50) covering the surfaces inside the micro pockets (60) and the perforated holes. An electro-optical material (30) fill the cavities (60), and a uniform layer of transparent conductive material (20) cover all the filled micro pockets (60). A top layer of a transparent substrate (10) cover the conductive layer (20).

11 Claims, 2 Drawing Sheets

US 6,923,701 B2

DISPLAY WITH MICRO POCKETS

This application claims priority to provisional U.S. Application Ser. No. 60/331,326 which was filed on Nov. 14, 2001, the entire disclosure of which is hereby incorporated by reference.

FIELD OF INVENTION

The present invention relates to a display, and a method of manufacturing the same. The display comprises an electrode layer, a substrate, which on the surface facing the electrode layer is covered with a set of electrode elements placed in cavities, and a layer of electro-optic material which is arranged between the electrode layer and the substrate.

BACKGROUND OF THE INVENTION

The present invention relates to the technical field of flat displays. An example of a display or screen according to that stated above (also called LCD, Liquid Crystal Display) is disclosed in SE-511,511 with the title: Display, relates to a liquid crystal display, comprising an electrode layer, a substrate, which on the surface facing the electrode layer is covered with a set of electrode elements, and a layer of electro-optic material which is arranged between the electrode layer and the substrate, the substrate being arranged behind the layer of electro-optic material in relation to the viewing direction, the substrate being arranged to support, on the one hand, electronic components for controlling the electrode elements and, on the other, conductive patterns for connecting the electronic components to the electrode elements, and the electrode elements forming picture elements in the display in cooperation with the electrode layer and the layer of electro-optic material.

One drawback with this display is the amount of electro-optic material needed to be filled between the electrode layer and the substrate. The manufacturing method results in a display with pixel regions filled with a continues layer of liquid crystals. The electro-optic material is quite expensive and it is desirable to minimise the amount used.

U.S. Pat. No. 6,266,122 with the title: Liquid crystal display device and method for manufacturing the same relates to a display including: a first substrate and a second substrate, a liquid crystal layer interposed between the first substrate and the second substrate. The first substrate includes a polymer wall formed of transparent resin, the liquid crystal layer includes a plurality of liquid crystal regions partitioned by the polymer wall, and liquid crystal molecules in the plurality of liquid crystal regions which are aligned in axial symmetry, with respect to an axis in a direction substantially perpendicular to a surface of the first substrate.

The main focus in this particular manufacturing method and display is only to achieve a wide viewing angle and improved quality of the displayed information.

The main advantages of the display according to the present invention described herein are reduced production costs compared to other manufacturing methods due to a minimal number of layers, and use of less expensive electro-optical material, combined with a thin and compact display.

SUMMARY OF THE INVENTION

The object of the present invention is to reduce the number of layers and a minimal use of electro-optical material, resulting in a more cost-effective production method and a robust display.

The above object as well as others is achieved with a manufacturing method according to claim 1. The manufacturing method comprises the steps of providing an isolating substrate and making cavities in the top surface of the substrate. For further reference the cavities are referred to as micro pockets. Each micro pockets is applied with holes in the centre extending from the upper surface of the micro pocket and all the way through to the underside of the isolating substrate. A conductive material is applied on the inner surfaces of the micro pockets and into the holes. Thus providing an electrical connection from the underside of the isolating substrate to the inside of the micro pockets. The micro pockets are filled with an electro-optical material and applied a uniform layer of a transparent common conductor to cover all the micro pockets with the electro-optical material. A transparent substrate is applied on top of the transparent conductor to make the top layer.

In a preferred embodiment of the invention, the isolating substrate is made of glassfibre composite, plastic or ceramics.

In another preferred embodiment, the forming of the cavities in the top layer of the isolating substrate can be formed by stamping, imprinting, engraving or etching in the isolating substrate.

In yet another preferred embodiment, the forming of the cavities in the top layer of the isolating substrate are formed by applying a separate sheet with holes, where each hole corresponds to one picture element or pixel. The sheet is mounted on the isolating substrate with depositing conductive material, gluing or heat sealing.

In a preferred embodiment of the invention, the conductive material is ITO, copper or aluminium.

In a preferred embodiment of the invention, the electro-optical material is liquid crystals, LED (inorganic or organic), electrochromic material, or another material changing its optical properties with an applied electric field.

In another preferred embodiment of the invention, the common conductor covering the micro pockets comprises ITO or SnO.

In yet another preferred embodiment of the invention, the transparent substrate is made of glass or plastic.

In addition to the manufacturing method of the thin display, the invention also comprises the display itself with the features stated in the appended claims.

According to one aspect, the invention is based on the understanding that in a display of this type, it is advantageous to let the electrode elements, which are commonly called pixels, be connected to a conductive pattern by means of conductive connections which emanate from the electrode elements in the direction away from the layer of electro-optic material, i.e. the underside of the isolating substrate. This will contribute to the form factor of the thin display. Another aspect also contributing to a thin display according to the invention is the cavities made directly in the isolating substrate, or formed with a separate sheet with holes mounted on the isolating substrate.

BRIEF DESCRIPTION OF THE DRAWINGS

The invention will now be described by means of exemplifying embodiments with reference to the accompanying drawings, in which.

DETAILED DESCRIPTION OF THE INVENTION

With reference to the figures, the following detailed description explains how the invention is obtained.

Figure 1:
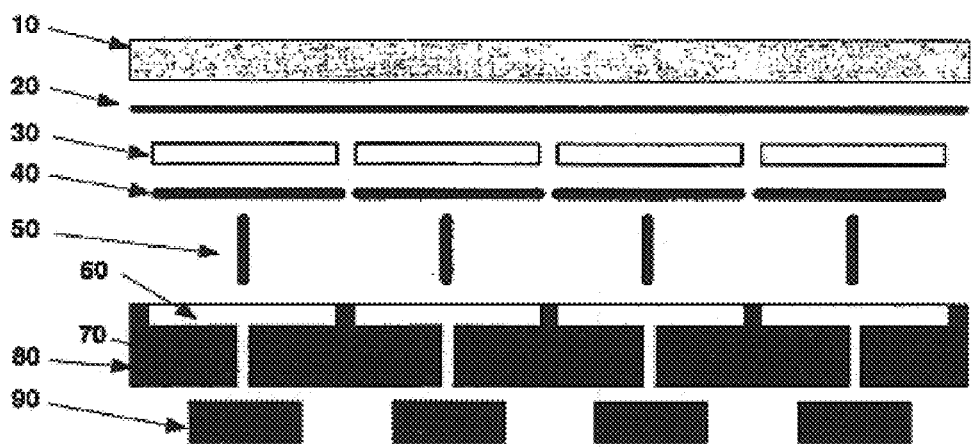
FIG. 1 is a schematic cross-sectional view of the components in the micro pocket display system of the present invention.

FIG. 1 shows a cross-section of the different components making the display.

The base of the display is made of an isolating substrate 80 with small cavities 60 imprinted. These cavities 60 will make the picture elements or pixels of the assembled display. For further reference the cavities are referred to as micro pockets. The isolating substrate 80 can be made of a glassfibre composite, plastic, ceramics or another material with isolating characteristics. The micro pockets 60 may be formed by stamping, imprinting, engraving or etching in the substrate 80. After the micro pockets 60 are established, holes 70 in the centre of each micro pocket 60 are made. These holes 70 will in turn provide for an electrical connection between the underside of the substrate and each pocket 60. This connection will be established when a conductive material 40, 50 is applied to the substrate 80. By applying a melted conductive material 40, 50, i.e. copper or aluminium, in the micro pockets 60, the holes 70 will also be filled with the conductive material 40, 50, thus enabling physical contact between the micro pockets 60 and electronic components 90 and wires connected on the underside of the isolating substrate 80. The micro pockets 60 are then filled with an electro-optical material 30, i.e. liquid crystal, LED, electrochromic material. The layer of electro-optical material 30 is covered with a layer of a transparent common conductor 20, i.e. ITO or SnO. The top layer consists of a transparent substrate 10 like glass or plastic.

Figure 2:
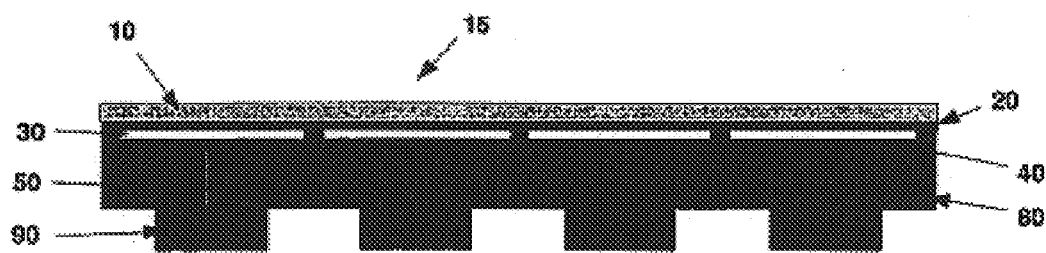
FIG. 2 is a schematic cross-sectional view of an assembled display according to the present invention.

FIG. 2 shows a cross-section of an assembled display with all the different layers that form the thin display according to the invention. The electrical connections 40, 50 with mounted wires and electronic components 90 will ensure activation of the electro-optical medium 30. The electro-optical material 30 is covered with a layer of a transparent common conductor 20. The top layer consists of a transparent substrate 10 like glass or plastic.

Figure 3:
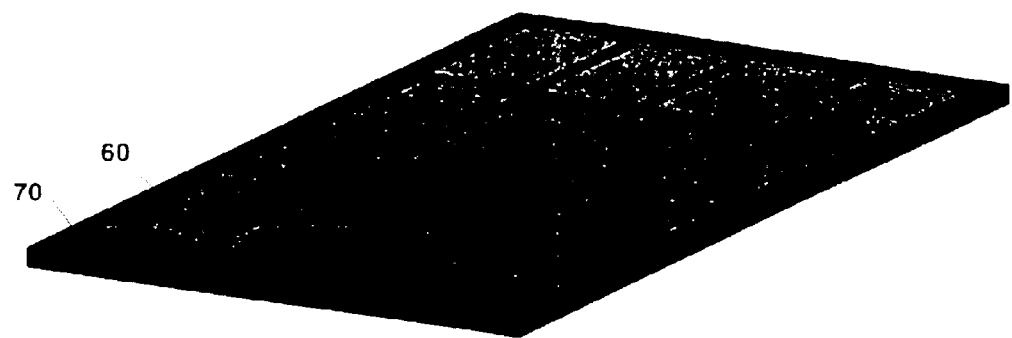
FIG. 3 is a schematic view according to method 1 with micro pockets for the electro-optical material formed in isolating substrate.

FIG. 3 shows a first method of applying the micro pockets 60 in the isolating substrate 70. The cavities or micro pocket are formed by stamping, imprinting, engraving or etching on the substrate 70.

Figure 4:
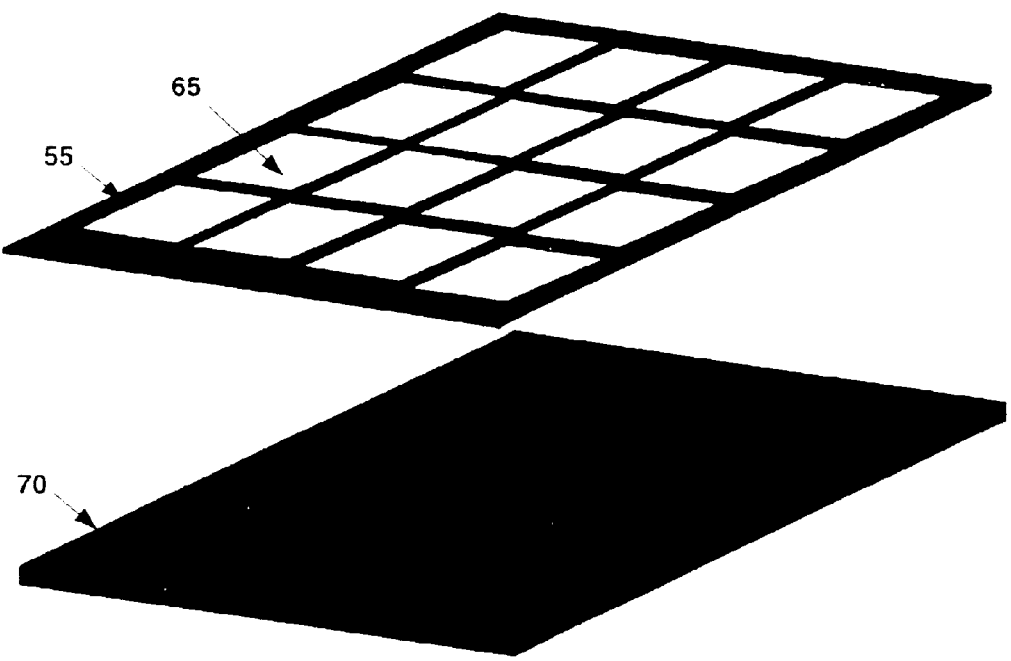
FIG. 4 is a schematic view according to method 2 with micro pockets for electro-optical material formed in a separate sheet.

FIG. 4 shows a second method of applying the micro pockets in the isolating substrate 70. This method involves the steps of forming holes 65 in a separate sheet, where each hole 65 corresponds to one picture element or pixel. The sheet 55 is mounted on the isolating substrate 70 with depositing conductive material, gluing or heat sealing.

The present invention is not restricted to the manufacturing method and display described herein. The display may be manufactured in different variations, for instance the holes in the cavities may be applied out of centre.

What is claim is:
1. A method of providing an isolating substrate, the method comprising:
    a) making cavities in the top surface of the isolating substrate
    b) making holes in the centre of each cavity extending from the upper surface of the cavity and all the way through to the underside of the isolating substrate,
    c) applying a conductive material on the inner surfaces of each cavity and into the holes, thus providing an electrical connection from the underside of the isolating substrate to the inside of the cavities,
    d) filling up the cavities with an electro-optical material,
    e) applying a uniform layer of a transparent common conductor to cover all the cavities filled with the electro-optical material, and
    f) applying a transparent substrate on top of the transparent conductor, making up the top layer.

2. The method according to claim 1, where in step a) the isolating substrate is made of glassfibre composite, plastic or ceramics.

3. The method according to claim 1, where in step b) the cavities made in the top side of the isolating substrate are formed by stamping, imprinting, engraving or etching in the isolating substrate.

4. The method according to claim 1, where in step d) the conductive material is ITO, copper or aluminium.

5. The method according to claim 1, where in step e) the electro-optical material comprises material that changes its optical properties with an applied electric field.

6. The method according to claim 5 where in step e) the electro-optical material comprises liquid crystals.

7. The method according to claim 5 where in step e) the electro-optical material comprises LED.

8. The method according to claim 5 where in step e) the electro-optical material comprises electrochromic material.

9. The method according to claim 1, where in step f) the common conductor covering the micro pockets comprises ITO or SnO.

10. The method according to claim 1, where in step g) the transparent substrate is made of glass or plastic.

11. A method of providing an isolating substrate, the method comprising:
    a) forming cavities by providing a separate sheet with holes, mounted on the isolating substrate,
    b) making holes in the centre of each cavity extending from the upper surface of the cavity and all the way through to the underside of the isolating substrate,
    c) applying a conductive material on the inner surfaces of each cavity and into the holes, thus providing an electrical connection from the underside of the isolating substrate to the inside of the cavities,
    d) filling up the cavities with an electro-optical material,
    e) applying a uniform layer of a transparent common conductor to cover all the cavities filled with the electro-optical material, and
    f) applying a transparent substrate on top of the transparent conductor, making up the top layer.

* * * * *